United States Patent [19]

Ohtsuka et al.

[11] Patent Number: 5,343,431
[45] Date of Patent: Aug. 30, 1994

[54] SEMICONDUCTOR MEMORY APPARATUS, TEST APPARATUS THEREFOR AND METHOD FOR RELIEVING SEMICONDUCTOR MEMORY APPARATUS FROM SHORT CIRCUIT

[75] Inventors: Takahiro Ohtsuka; Shozo Shirota, both of Itami, Japan

[73] Assignee: Mitsubishi Denki Kabushiki Kaisha, Tokyo, Japan

[21] Appl. No.: 43,225

[22] Filed: Apr. 6, 1993

[30] Foreign Application Priority Data

Apr. 21, 1992 [JP] Japan .................................. 4-128134

[51] Int. Cl.⁵ .............................................. G11C 7/00
[52] U.S. Cl. ..................................... 365/201; 365/200; 371/21.1
[58] Field of Search ............... 365/201, 200; 371/21.1, 371/21.4, 10.1

[56] References Cited

U.S. PATENT DOCUMENTS

| | | | |
|---|---|---|---|
| 4,744,058 | 5/1988 | Kawashima | 365/201 |
| 4,860,260 | 8/1989 | Saito | 365/201 |
| 5,181,205 | 1/1993 | Kertis | 365/201 |

*Primary Examiner*—Eugene R. LaRoche
*Assistant Examiner*—A. Zarabian

*Attorney, Agent, or Firm*—Lowe, Price, LeBlanc & Becker

[57] ABSTRACT

A semiconductor memory apparatus capable of judging whether or not there is short circuit between bit lines 1 (word lines) by respectively connecting a plurality of the bit lines 1 (word lines), wired in parallel to each other so as to select memory cell for outputting data from a memory cell array 4 in which memory cells are arranged in the form of matrix, connected to power source potential line 14 and ground potential line 16 alternately through switching elements 5, 6 respectively, thereby measuring leak current flowing between the both lines 14 and 16 in the state where the switching elements 5, 6 are ON, a testing apparatus being provided with a power source 10 supplying to each of the switching elements 5, 6 of this semiconductor memory apparatus and with an ampere meter 11 for measuring leak current, and relieving method for the semiconductor memory apparatus from short circuit between the bit lines (word lines) by making the switching elements 5, 6 ON as well as applying overvoltage to the bit lines (word lines) from the power source 10, thereby generating Joule heat at foreign matter which short-circuits between adjacent bit lines 1 (word lines) so as to burn off the foreign matter by the Joule heat.

12 Claims, 6 Drawing Sheets

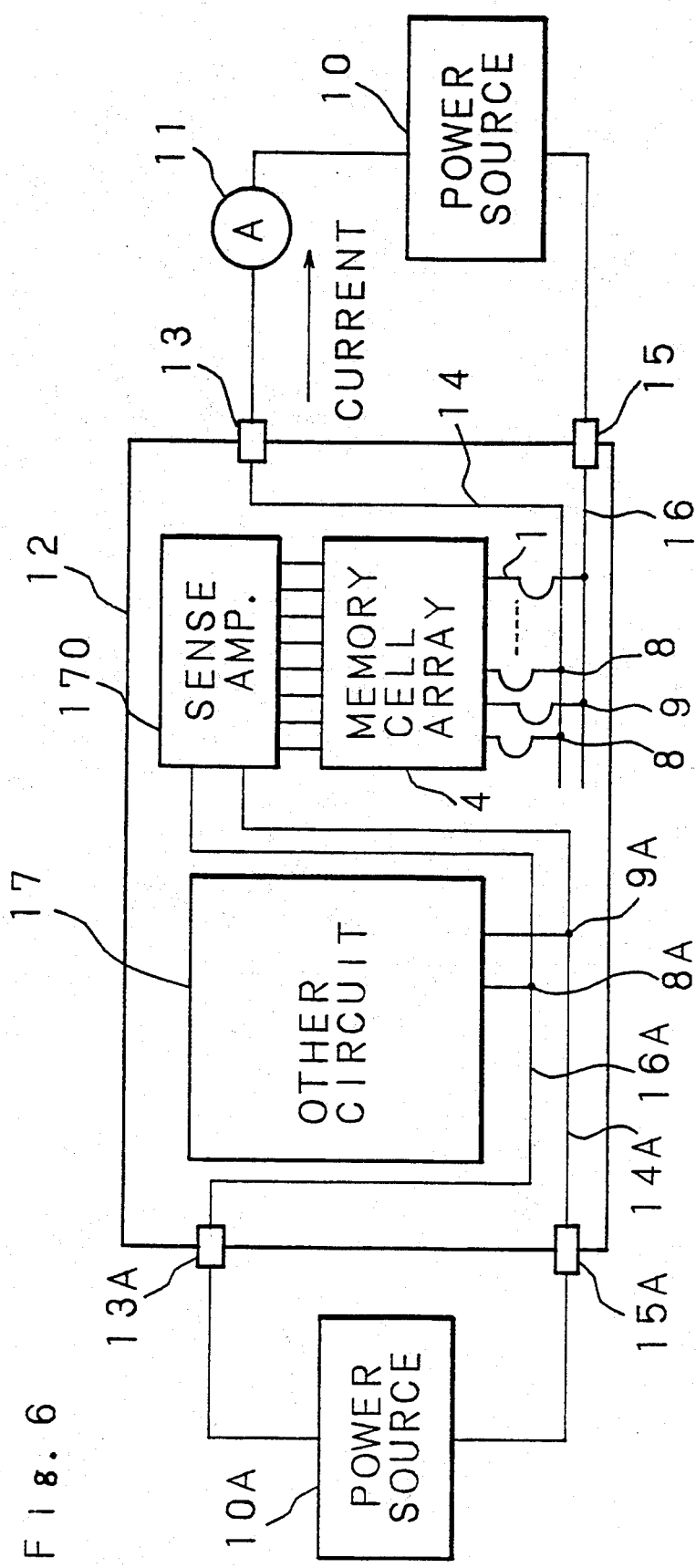

SEMICONDUCTOR MEMORY APPARATUS, TEST APPARATUS THEREFOR AND METHOD FOR RELIEVING SEMICONDUCTOR MEMORY APPARATUS FROM SHORT CIRCUIT

BACKGROUND OF THE INVENTION

1. Field of the Invention

This invention relates to a semiconductor memory apparatus, particularly to a semiconductor memory apparatus which is composed of memory cell array and has signal lines, that is, memory cell select lines (bit lines, word lines) selecting the memory cell for writing in and reading out data, and further relates to a testing apparatus for detecting whether there is a short circuit or not between the memory cell select lines (bit lines and/or word lines) thereof and to a method for relieving the semiconductor memory apparatus from short circuit caused by foreign matter between the memory cell select liens.

2. Description of Related Art

FIG. 1 is a schematic diagram showing a configuration example of a conventional- semiconductor memory apparatus.

In FIG. 1, reference symbol 1 designates a bit line, 2 a selector, 3 a row decoder, and 4 a memory cell array respectively.

The memory cell array 4 is configured by arranging memory cells in the form of matrix. The bit lines 1 as column direction memory cell select lines of the memory cell array 4 are provided in plural number and wired in parallel to each other, and each bit line 1 connects memory cells of each column on the memory cell array 4 to the selector 2. Further, the word lines (not shown) as row direction memory cell select lines are also provided in plural number and wired in parallel to each other, and each word line connects memory cells of each row on the memory cell array 4 to the row decoder 3.

Such a conventional semiconductor memory apparatus is operated as follows.

Assuming that one word line is designated by the row decoder 3, memory contents of all the memory cells on the designated world line are read out and outputted to all the bit lines 1, and only the data outputted to one or more bit lines 1 selected by the selector 2 are read out.

By the way, as shown in FIG. 1, when foreign matter E attaches to two bit lines 1, 1 each being adjacent to each other, inter bit line short circuit between bit lines is generated. This is also the same as the word lines.

Conventionally, rejection of products in which inter bit line and/or inter word line short circuit in the process of producing and examination has been performed by such an indirect method that the memory contents of the memory cells are read out and judged whether or not it coincides with a predetermined expected value, not such a method that whether or not inter bit line and/or inter word line is generated in real is examined directly.

As aforementioned, in the conventional semiconductor memory apparatus, since short circuit generated between the bit lines and/or inter word lines as memory cell select lines of the memory cells was judged by the indirect method, the apparatus was not reliable in accuracy. There was also a problem that it required a long time to examine short circuit.

Further, there is also a problem that yield is low in production process since a product which was judged to have generated inter bit line and/or inter word line short circuit was rejected as a defective.

SUMMARY OF THE INVENTION

The present invention has been devised in consideration of such circumstances and the object thereof is to provide a semiconductor memory apparatus capable of detecting generation of inter the memory cell select line short circuit in high accuracy and in a short time by observing leak current generating while short circuit is generated between the memory cell select lines.

And the object thereof is to provide a testing apparatus therefor.

Further, the object thereof is to provide a relieving method capable of improving yield by relieving the apparatus from inter memory cell select line short circuit in the semiconductor memory apparatus.

In the semiconductor memory apparatus off the present invention, for outputting data from the memory call array in which memory cells are arranged in the form of matrix, a plurality of the memory cell select lines (bit lines, word lines) which are parallel to each other are connected to an power source potential line and a ground potential line alternately through switching elements respectively. Accordingly, it can be judged whether there is inter memory cell select line short circuit or not by observing leak current flowing between the power source potential line and the ground potential line.

The testing apparatus of the semiconductor memory apparatus of the present invention is provided with a power source supplying power source potential to each switching element of the aforesaid semiconductor memory apparatus and with a current measuring apparatus (ampere meter) for measuring leak current.

Further, the relieving method for the semiconductor memory apparatus from inter memory cell select, line short circuit of the semiconductor memory apparatus of the invention burns off foreign matter according to Joule heat by making switching elements of the aforesaid semiconductor memory apparatus ON as well as applying overvoltage to the memory cell select liens from the electric source, by generating Joule heat at the foreign matter which short-circuits the adjacent memory cell select liens.

The above and further objects and features of the invention will more fully be apparent from the following detailed description with accompanying drawings.

BRIEF DESCRIPTION OF THE DRAWINGS

FIG. 6 is a circuit diagram showing another configuration example of a test apparatus of the invention.

DESCRIPTION OF THE PREFERRED EMBODIMENTS

In the following, explanation of the invention will be made in detail referring to drawings showing the embodiments thereof.

Figure 1:
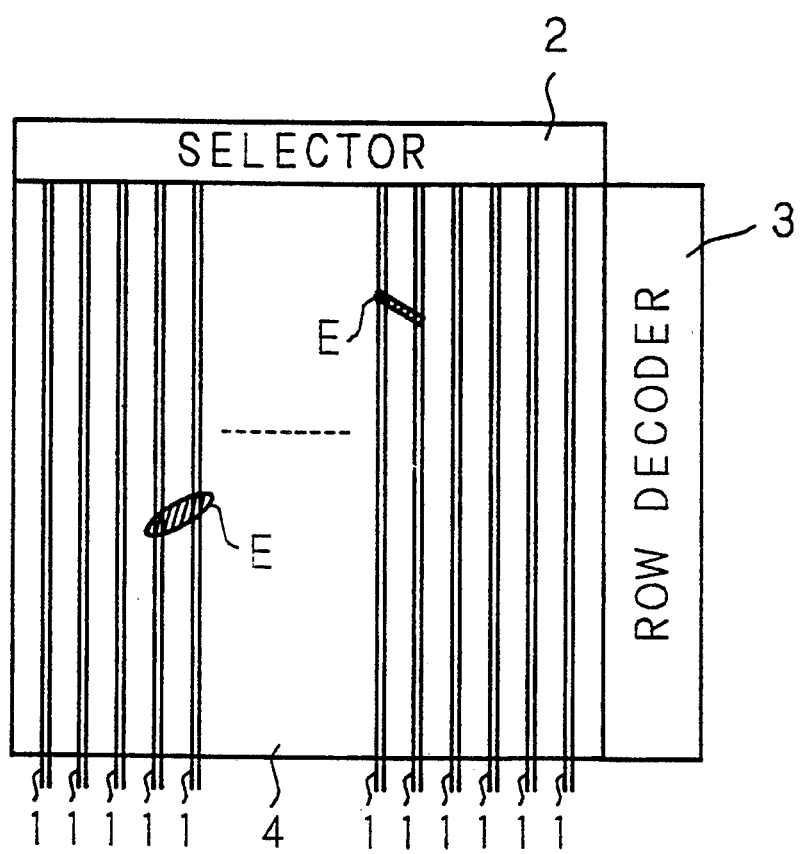
FIG. 1 is a schematic diagram showing a configuration example of a conventional semiconductor memory apparatus.
Figure 2:
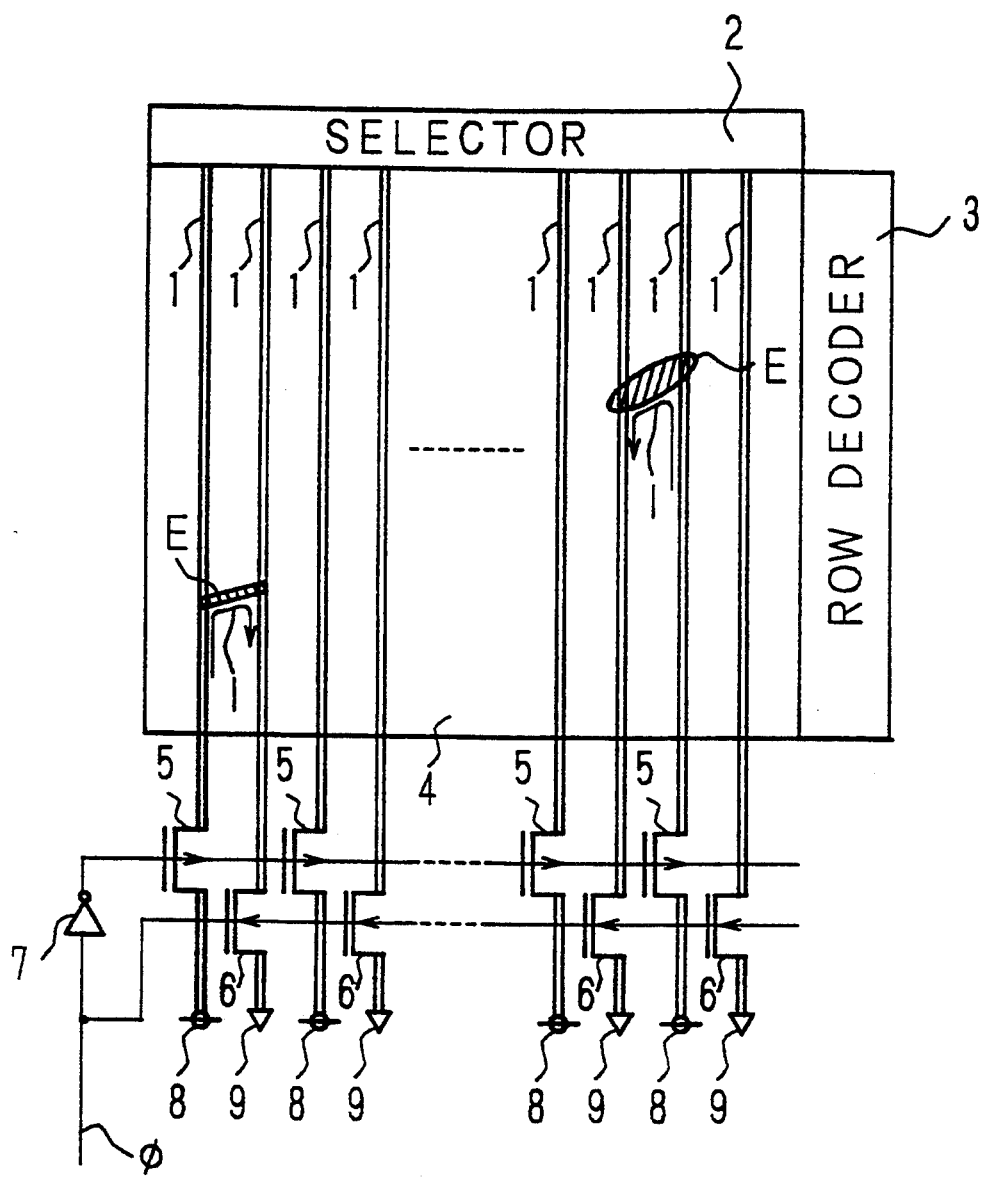
FIG. 2 is a schematic diagram showing a configuration of one embodiment of a semiconductor apparatus related to the invention.

FIG. 2 is a schematic diagram showing a configuration of one embodiment of the semiconductor memory apparatus related to the invention, and the same reference symbols as in FIG. 1 referred in the explanation of the aforesaid conventional example show the same or corresponding portions.

In addition, in each embodiment to be described in the following, short circuit of the bit lines to be column direction memory cell select lines as memory cell select lines is explained, however, the same configuration and method used in the above case can also be applied to the case of the word lines to be row direction memory cell select lines.

In FIG. 2, reference symbol 1 designates a bit line, 2 a selector, 3 a row decoder, and 4 a memory cell array respectively.

The memory cell array 4 is configured by arranging memory cells in the form of matrix. The bit lines 1 as column direction memory cell select lines of the memory cell array 4 are provided in plural number and wired in parallel to each other, and each bit line 1 connects memory cells of each column on the memory cell array 4 to the selector 2. Further, the word lines (not shown) as row direction memory cell select lines are also provided in plural number and wired in parallel to each other, and each word line connects memory cells of each row on the memory cell array 4 to the row decoder 3.

Reference symbol 5 designates a P channel transistor as a switching element and 6 an N channel transistor as the same. In addition, to the N channel transistors 6, control signal φ is given directly, and to the P channel transistors 5, control signal φ is given through an inverters 7. Accordingly, since the N channel transistors 6 are ON at "H" level of the control signal φ and the P channel transistors 5 are ON at "L" level obtained by inverting "H" level of the control signal φ by the inverters 7, the both transistors 5 and 6 are ON/OFF at the same timing.

Reference symbol 8 designates Vcc (power source potential) and 9 Vss (ground potential) respectively.

The P channel transistors 5 and the N channel transistors 6 are connected to a plurality of the bit lines I alternately, and the P channel transistor 5 is connected the power source potential 8 and the N channel transistor 6 is to the ground potential 9 at the respective sources.

Since the operation in reading out data of such a semiconductor memory apparatus of the invention is the same as the conventional example, the explanation will be omitted. But the P channel transistors 5 and N channel transistors 6 are usually off by making the control signal φ "L" level.

Figure 3:
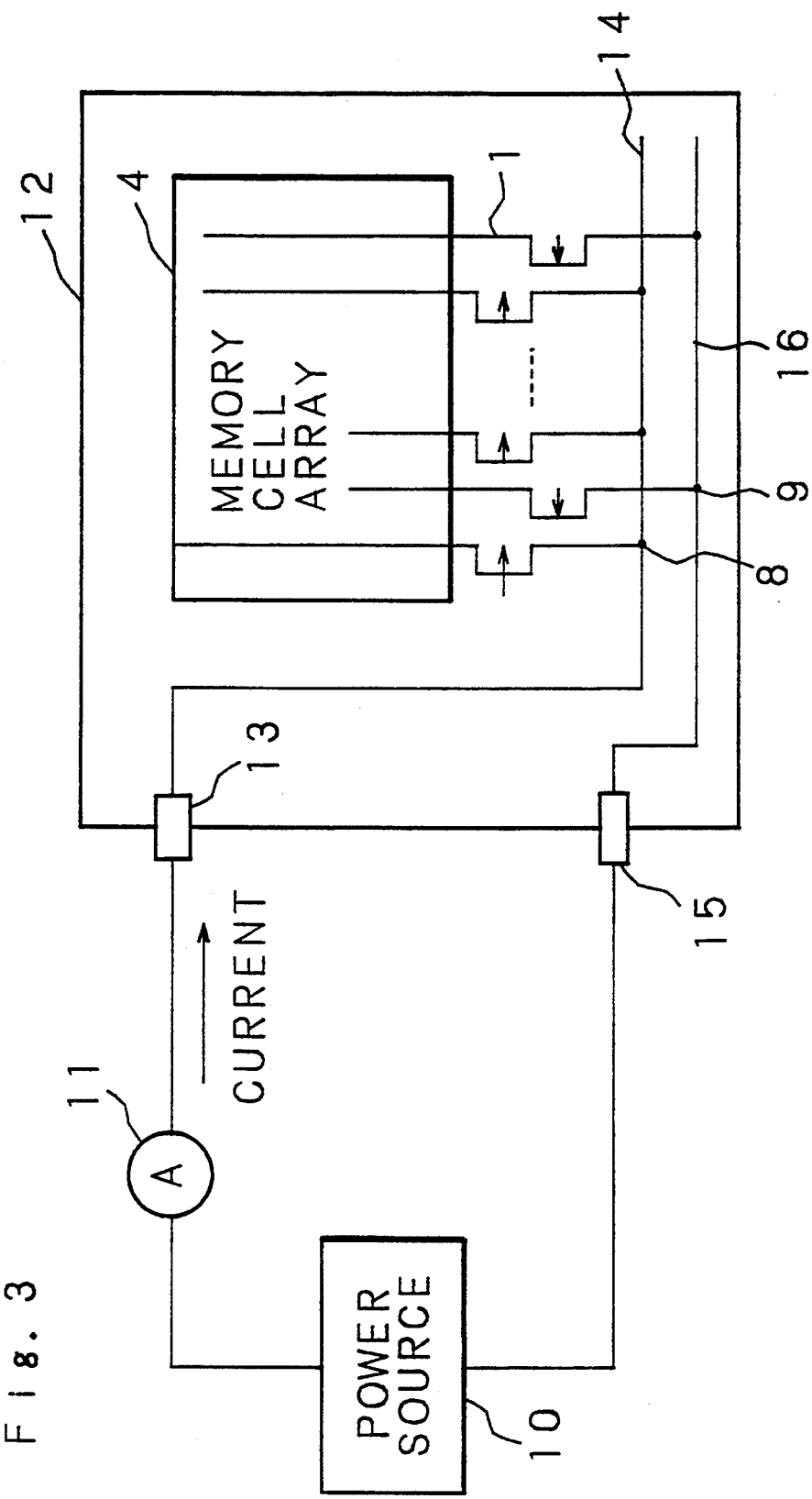
FIG. 3 is a circuit diagram showing a configuration example of a test apparatus of the invention which measures leak current between bit lines caused by inter bit line short circuit of a semiconductor memory apparatus related to the invention.

FIG. 3 is a circuit diagram showing a configuration example of a testing apparatus of the invention which measures leak current between the bit lines caused by inter bit line short circuit of the semiconductor memory apparatus of the invention having above-mentioned configuration.

In FIG. 3, reference symbol 10 designates a power source, 11 an ampere meter as a current measuring apparatus which measures leak current between the bit lines, and 12 a chip in which such a semiconductor memory apparatus as that shown in the above-described FIG. 2 or a memory built-in type microcomputer which has that semiconductor memory apparatus within is formed.

Reference symbol 13 designates a Vcc pin provided on the chip 12, 14 a power source potential line in the chip 12, 15 a Vss pin provided at the chips 12, and 16 designates a ground potential line in the chip 12 respectively, and the power source potential line 14 is connected to the Vcc pin 13 and the ground potential line 16 to the Vss pin 15 respectively.

Further, a terminal at the power source potential side of the power source 10 is connected to the Vcc pin 13 through the ampere meter 11 and similarly the ground potential side to the Vss pin 15.

Next, explanation will be made on the operation off the testing apparatus for inter bit line short circuit, of the semiconductor memory apparatus of the invention having such a configuration.

Now, assuming that a testing mode is set in the semiconductor memory apparatus of the present invention, and both the selector 2 and the row decoder 3 are in the nonactive state. In this state, when the control signal φ made "H" level and the P channel transistors 5 and the N channel transistors 6 are made ON state at the same time, a plurality of the bit lines 1 are alternately connected to the power source potential ]line 14 and the ground potential line 16. Therefore, when foreign matter E lies across the two adjacent bit lines 1, 1 and thereby inter bit line short circuit is generated, leak current I between the power source potential 8 and the ground potential 9 increases as against the usual time. Accordingly, when this leak current is measured by the ampere meter 11, it can be judged that whether or not inter bit line short circuit is generated.

Usually, at IC stand by leak (clock stop time, normal temperature), although there is difference between kinds of semiconductor memory apparatus, leak current is about several $\mu A$. But when short circuit is caused by a foreign matter E between the power source potential 8 and the ground potential 9, the leak current becomes hundreds $\mu A$ to tens mA.

As is described above, according to the above-mentioned embodiment, although it is possible to detect whether or not there is short circuit between the lines without reading-out testing of the memory cells, when it is necessary to specify that inter bit line short circuit is generated, that is, between which bit lines foreign matter E lies, it is proper to perform the same reading-out testing of the memory cell as the conventional.

Next, explanation will be made on the relieving method for semiconductor memory apparatus from inter bit line short circuit of the semiconductor memory apparatus of the invention.

As aforementioned, in the testing apparatus of the semiconductor memory apparatus of the invention, when both the selector 2 and the row decoder 3 are made non-active, and the P channel transistors 5 and the N channel transistors 6 are made ON, since whether or not short circuit caused by foreign matter E between the bit lines is generated is judged by a measured value of the ampere matter 11, when it is judged that inter bit line short circuit is generated, voltage of the power source 10 is increased and overvoltage is applied to the power source potential 8. Thereby, when foreign matter E lines across the bit lines 1, 1, since the foreign matter E generates Joule heat and it is burned off, it becomes possible to relieve inter bit line short circuit.

Figure 4:
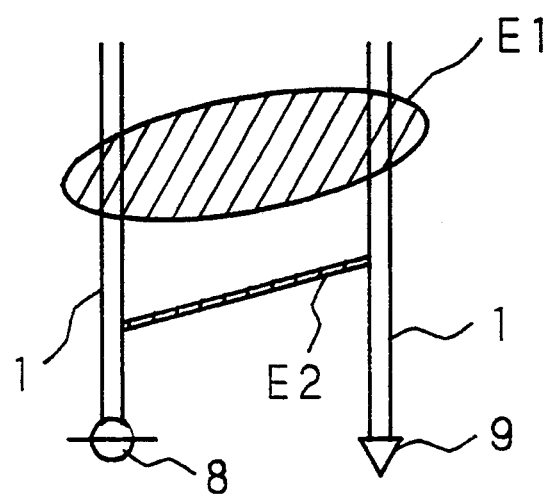
FIG. 4 is a schematic diagram showing a state in which foreign matter attaches between bit liens adjacent to each other.
Figure 5:
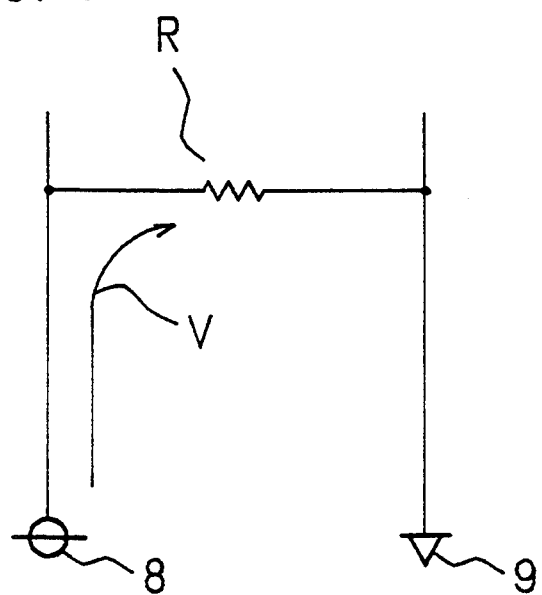
FIG. 5 is an equivalent circuit diagram of the schematic diagram of FIG. 4.

In this case, Joule heat is generated at only the foreign matter E lying across the bit lines 1, 1. That is, as shown in the schematic diagram in FIG. 4, the foreign matter E1 which lies across the adjacent bit lines 1, 1 and has low conductivity or the foreign matter E2 which has a narrow conductive passage, as shown in the equivalent circuit diagram in FIG. 5, functions as a resistance R, therefore, it generates Joule heat and burnt off when overvoltage V is applied.

Accordingly, it becomes possible to relieve the semiconductor memory apparatus from inter bit line short circuit by only supplying overvoltage from the power source 10 without specifying the bit line 1 generating leak current.

In addition, in the testing circuit shown in the aforesaid FIG. 3, when the power source potential line 14 and the ground potential line 16 are connected also to a circuit other than the memory cell array 4, there is a possibility that the fact has a bad influence upon the circuit other than the memory cell array 4. Therefore, as shown in the circuit diagram shown in FIG. 6, when feeding to the memory cell array 4 is done by a different system from that to a circuit 17 other than the memory cell array 4, it becomes possible to prevent such a situation that overvoltage made to flow from the power source 10 for relieving the memory cell 4 from inter bit line short circuit destroys the other circuit 17.

To be concrete, the other circuit 17 is connected to the power source 10A through the Vcc pin 13A, power source potential line 14A, power source potential 8A, ground potential. 9A, ground potential line 16A, and Vss pin 15A, and the feeding system thereof is different from that of the power source 10 which feeds to the memory cell array 4.

In addition, in FIG. 6, reference symbol 170 designates a sense amplifier as a concrete example of the other circuit fed from the power source 10A.

As has been explained in detail, according to the present invention, a semiconductor memory apparatus is realized which has a configuration capable of detecting whether or not there is generated short circuit between bit lines (word lines) accurately and quickly.

And, according to a testing apparatus of the present invention, it becomes possible to judge whether or not there is generated short circuit between the bit lines (word lines) without reading out data from the memory cell array of the memory apparatus to compare it with an expected value.

Further, according to a relieving method for the semiconductor memory apparatus from short circuit between the bit lines (word lines) of the present invention, since it becomes possible to relieve the apparatus from short circuit between the bit lines (word lines) without specifying a position at which short circuit between the bit lines (word lines) has been generated, yield in the production process is improved.

In each of the embodiments above mentioned, bit lines to be column direction memory cell select lines are used as memory cell select lines, however, it is a matter of course that the invention is applicable to short circuit of word lines to be row direction memory cell select lines.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended braced by the claims.

What is claimed is:

1. A semiconductor memory apparatus, comprising:
   a memory cell array in which memory cells are arranged in the form of matrix in column direction × row direction;
   a plurality of column direction memory cell select lines each which is commonly connected to memory cells of each column of said memory cell array; and
   a plurality of row direction memory cell select lines each which is commonly connected to memory cells of each row of said memory cell array;
   wherein data is read out from the memory cell which is commonly selected by one of said column direction memory cell select line and one of said row direction memory cell select line,
   further comprising a plurality of switching elements which are disposed to connect adjacent ones of said column direction memory cell select lines and/or adjacent ones of said row direction memory cell select lines successively to a power source potential line and a ground potential line respectively.

2. A semiconductor memory apparatus as set forth in claim 1, wherein said power source potential line and ground potential line are connected to an independent power source for exclusive use.

3. A semiconductor memory apparatus, comprising:
   a memory cell array in which memory cells are arranged in the form of matrix in column direction × row direction;
   a plurality of bit lines each which is commonly connected to memory cells of each column of said memory cell array; and
   a plurality of word lines each which is commonly connected to memory cells of each row of said memory cell array;
   wherein data is read out from the memory cell which is commonly selected by one of said bit lines and one of said word lines,
   further comprising a plurality of switching elements which are disposed to connect adjacent ones of said bit lines and/or adjacent ones of said word lines successively to a power source potential line and a ground potential line respectively.

4. A semiconductor memory apparatus as set forth in claim 3, wherein said power source potential line and said ground potential line are connected to an independent power source for exclusive use.

5. A testing apparatus for detecting short circuit between adjacent memory cell select lines of column direction memory cell select lines and/or row direction memory cell select lines of a semiconductor memory apparatus, said semiconductor memory apparatus comprising:
   a memory cell array in which memory cells are arranged in the form of matrix in column direction × row direction;
   a plurality of column direction memory cell select lines each which is commonly connected to memory cells of each column of said memory cell array;

a plurality of row direction memory cell select lines each which is commonly connected to memory cells of each row of said memory cell array; and a plurality of switching elements which are disposed to connect said respective column direction memory cell select lines and/or said row direction memory cell select lines successively to a power source potential line and a ground potential line alternatively, wherein data is read out from the memory cell which is commonly selected by one of said column direction memory cell select line and one of said row direction memory cell select line, comprising:

a power source connected to said power source potential line and said ground potential line;

a control signal line making said each of said switching elements ON/OFF at the same time, and a current measuring apparatus which measures current flowing between said power source potential line and said ground potential line in the case where said each of said switching elements is ON.

6. A testing apparatus as set forth in claim 5, wherein said power source potential line and said ground potential line are connected to the independent power source for exclusive use.

7. A testing apparatus for detecting short circuit between adjacent bit lines and/or word lines of a semiconductor memory apparatus, said semiconductor memory apparatus comprising:

a memory cell array in which memory cells are arranged in the form of matrix in column direction × row direction;

a plurality of bit lines each which is commonly connected to memory cells of each column of said memory cell array;

a plurality of word lines each which is commonly connected to memory cells of each row of said memory cell array; and a plurality of switching elements which are disposed to connect said respective bit lines and/or said word lines successively to a power source potential line and a ground potential line alternately, wherein data is read out from the memory cell which is commonly selected by one of said bit line and one of said word line, comprising:

a power source connected to said power source potential line and said ground potential line;

a control signal line making said each of said switching elements ON/OFF at the same time; and a current measuring apparatus which measures current flowing between said power source potential line and said ground potential line in the case where said each of said switching elements is ON.

8. A testing apparatus as set forth in claim 7, wherein said power source potential line and said ground potential line are connected to the independent power source for exclusive use.

9. A method for relieving a semiconductor memory apparatus from short circuit between adjacent memory cell select lines of column direction memory cell select lines and/or row direction memory cell select lines of a semiconductor memory apparatus, said semiconductor memory apparatus comprising:

a memory cell array in which memory cells are arranged in the form of matrix in column direction × row direction;

a plurality of column direction memory cell select lines each which is commonly connected to memory cells of each column of said memory cell array;

a plurality of row direction memory cell select lines each which is commonly connected to memory cells of each row of said memory cell array; and a plurality of switching elements which are disposed to connect said respective column direction memory cell select lines and/or said row direction memory cell select lines successively to a power source potential line and a ground potential line alternatively, wherein data is read out from the memory cell which is commonly selected by one of said column direction memory cell select line and one of said row direction memory cell select line, comprising steps of:

connecting said power source potential line and said ground potential line to the power source;

making each of said switching elements ON by said control signal; and applying overvoltage to said memory cell select lines to burn off foreign matter which short-circuit between adjacent memory cell select lines by Joule heat according to said overvoltage.

10. A method for relieving semiconductor memory apparatus as set forth in claim 9, wherein said power source potential line and ground potential line are connected to the independent power source for exclusive use.

11. A method for relieving a semiconductor memory apparatus from short circuit between adjacent bit lines and/or word lines of a semiconductor memory apparatus, said semiconductor memory apparatus comprising:

a memory cell array in which memory cells are arranged in the form of matrix in column direction × row direction;

a plurality of bit lines each which is commonly connected to memory cells of each column of said memory cell array;

a plurality of word lines each which is commonly connected to memory cells of each row of said memory cell array; and a plurality of switching elements which are disposed to connect said respective bit lines and/or said word lines successively to a power source potential line and a ground potential line alternately, wherein data is read out from the memory cell which is commonly selected by one of said bit line and one of said word line, comprising steps of:

connecting said power source potential line and said ground potential line to the power source;

making each of said switching elements ON by said control signal; and applying overvoltage to said bit lines and/or word lines to burn off foreign matter which short-circuits between adjacent bit lines and/or word lines by Joule heat according to said overvoltage.

12. A method for relieving semiconductor memory apparatus as set forth in claim 10, wherein said power source potential line and said ground potential line are connected to the independent power source for exclusive use.

* * * * *